United States Patent
Liu et al.

(10) Patent No.: US 7,586,553 B2
(45) Date of Patent: *Sep. 8, 2009

(54) ACTIVE MATRIX DEVICE WITH ELECTROSTATIC PROTECTION

(75) Inventors: Chuan-Feng Liu, Hsinchu (TW); Chi-Ming Wu, Hsinchu (TW)

(73) Assignee: Prime View International Co., Ltd., Hsinchu (TW)

( * ) Notice: Subject to any disclaimer, the term of this patent is extended or adjusted under 35 U.S.C. 154(b) by 145 days.

This patent is subject to a terminal disclaimer.

(21) Appl. No.: 11/796,356

(22) Filed: Apr. 27, 2007

(65) Prior Publication Data

US 2008/0170343 A1 Jul. 17, 2008

(30) Foreign Application Priority Data

Jan. 11, 2007 (TW) ............................... 96101139 A

(51) Int. Cl.
*G02F 1/1333* (2006.01)
(52) U.S. Cl. ...................................................... 349/40
(58) Field of Classification Search .................. 349/40
See application file for complete search history.

(56) References Cited

U.S. PATENT DOCUMENTS

| 6,639,633 | B2 * | 10/2003 | Song et al. | 349/40 |
| 2002/0057392 | A1 * | 5/2002 | Ha | 349/40 |
| 2008/0136986 | A1 * | 6/2008 | Kim et al. | 349/40 |
| 2008/0239613 | A1 * | 10/2008 | Liu et al. | 361/220 |
| 2008/0253043 | A1 * | 10/2008 | Wu et al. | 361/56 |

* cited by examiner

*Primary Examiner*—Frank G Font
*Assistant Examiner*—Mary A El Shammaa
(74) *Attorney, Agent, or Firm*—CKC & Partners Co., Ltd.

(57) ABSTRACT

An active matrix device includes a substrate, scan lines, data lines, pixels, electrostatic discharge ring, a circuit board and a electrostatic protection circuit. The scan lines and data lines are disposed on the substrate, in which the data lines cross the scan lines. The pixels are electrically coupled to the data lines and the scan lines. The electrostatic discharge ring is disposed on the substrate. The electrostatic protection circuit is coupled between the electrostatic discharge ring and the circuit board, in which the electrostatic protection circuit prevents the electrostatic current on the circuit board from entering the substrate.

8 Claims, 3 Drawing Sheets

ACTIVE MATRIX DEVICE WITH ELECTROSTATIC PROTECTION

RELATED APPLICATIONS

This application claims priority to Taiwan Application Serial Number 96101139, filed Jan. 11, 2007, which is herein incorporated by reference.

BACKGROUND

1. Field of Invention

The present invention relates to an active matrix device. More particularly, the present invention relates to an active matrix device with electrostatic protection.

2. Description of Related Art

The voltage of electrostatic energy in the environment might be as high as several thousand volts, which induces a huge electrostatic current. If such huge electrostatic current is directed into a circuit, such as an active matrix device, then the components of the active matrix device might be damaged. To prevent the components of the active matrix device from being damaged by the electrostatic current, an electrostatic protection circuit is disposed on the active matrix device. The electrostatic protection circuit consumes the electrostatic current, and prevents the electronic components of the active matrix device from being damaged.

In a conventional active matrix device, the electrostatic protection circuit is coupled to the electrostatic discharge ring (ESD ring). When the electrostatic current appears in the scan lines or the data lines, the electrostatic current is discharged to the ESD ring through the electrostatic protection circuit, and is consumed by the ESD ring. Therefore, the electrostatic current on the data lines or the scan lines cannot enter the electronic components of the conventional active matrix device, and the electronic components can be saved from being damaged by the electrostatic current.

However, in a conventional active matrix device, the electrostatic discharge ring is usually connected to a printed circuit board with a wire. As a result, the electrostatic current in the printed circuit board is able to enter the substrate by passing through the wire between the electrostatic discharge ring and the printed circuit. Thus, the electrostatic current may damage the electronic components on the substrate.

For the foregoing reasons, there is a need for a new active matrix device that can prevent the electrostatic current on the printed circuit board from entering the substrate and damaging the electronic components on the substrate.

SUMMARY

According to one embodiment of the present invention, an active matrix device includes a substrate, scan lines, data lines, pixels, an electrostatic discharge ring, a circuit board and an electrostatic protection circuit. The scan lines are disposed on the substrate. The data lines are disposed on the substrate, in which the data lines cross the scan lines. The pixels are electrically coupled to the data lines and the scan lines. The electrostatic discharge ring is disposed on the substrate. The electrostatic protection circuit is coupled between the electrostatic discharge ring and the circuit board, in which the electrostatic protection circuit prevents the electrostatic current disposed one the circuit board from entering the substrate.

According to another embodiment of the present invention, an active matrix device includes a substrate, a plurality of scan lines, a plurality of data lines, a plurality of pixels, an electrostatic discharge ring, a circuit board, a first electrostatic protection circuit, a plurality of second electrostatic protection circuits.

The scan lines are disposed on the substrate. The data lines disposed on the substrate cross the scan lines. The pixels are electrically coupled to the data lines and the scan lines. The electrostatic discharge ring is disposed on the substrate. The first electrostatic protection circuit coupled between the electrostatic discharge ring and the circuit board, in which the electrostatic protection circuit prevents the electrostatic current disposed on the circuit board from entering the substrate.

Every second electrostatic protection circuit comprises at least one first diode and at least one second diode. The first diode has an anode coupled to the electrostatic discharge ring, and a cathode coupled to one of the data lines. The second diode has an anode coupled to one of the data lines, and a cathode coupled to the electrostatic discharge ring.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
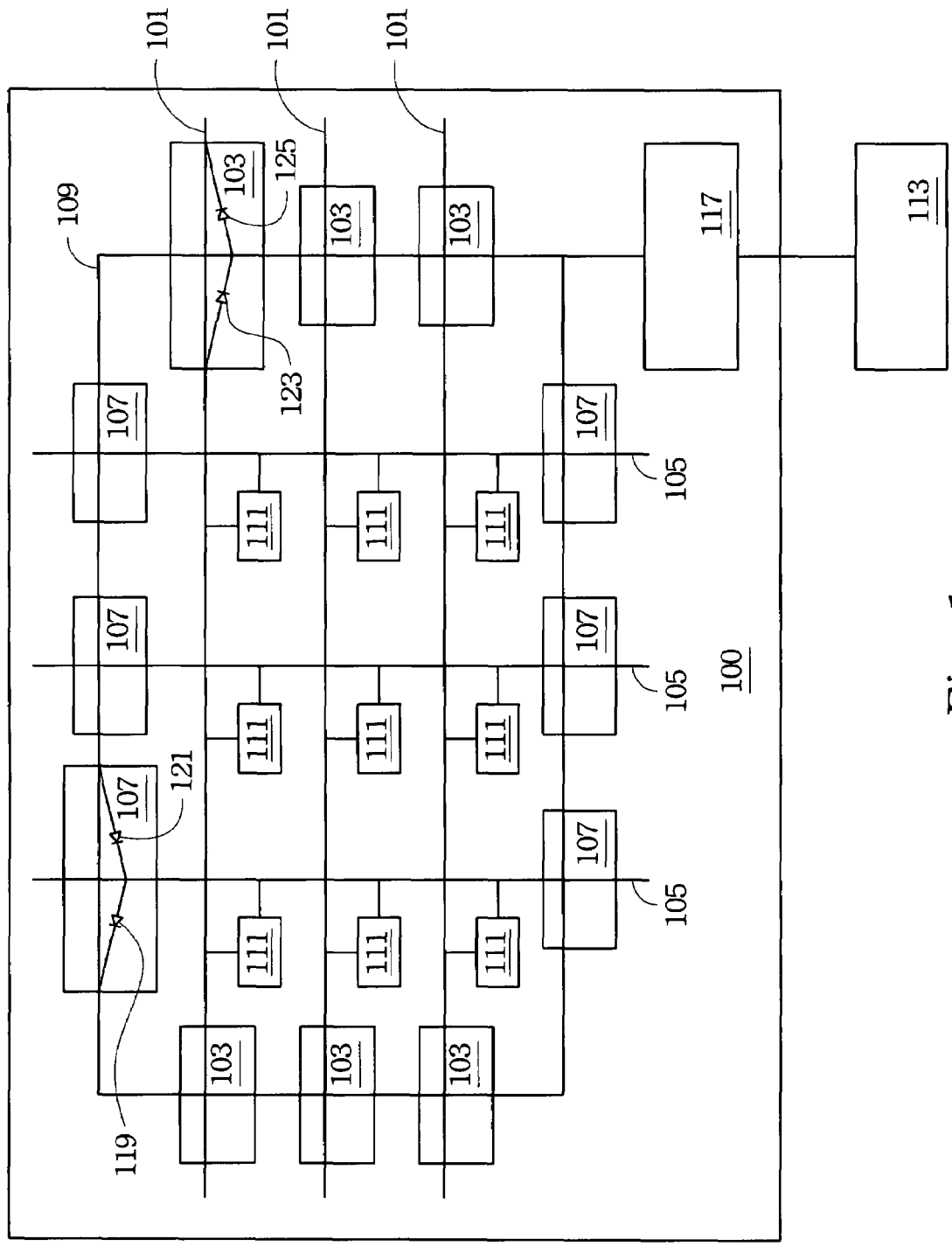
FIG. 1 is an active matrix device according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows the active matrix device according to one embodiment of present invention. The active matrix device includes a substrate 100, scan lines 101, data lines 105, pixels 111, a second electrostatic protection circuit 107, a third electrostatic protection circuit 103, an electrostatic discharge ring 109, a circuit board 113, and a first electrostatic protection circuit 117. The circuit board 113 might be a flexible printed circuit board (FPC) 113.

Scan lines 101, data lines 105, pixels 111, the second electrostatic protection circuit 107, the third electrostatic protection circuit 103 and the electrostatic discharge ring 109 are disposed on the substrate 100. Pixels 111 are coupled to the scan lines 101 and the data lines 105. The scan lines 101 and the data lines 105 are coupled to the electrostatic discharge ring 109 through the third electrostatic protection circuit 103 and the second electrostatic protection circuit 107, respectively. The first electrostatic protection circuit 117 is coupled to the FPC 113 and the electrostatic discharge ring 109.

The second electrostatic protection circuit 107 includes a diode 119 and a diode 121, in which the anodes and the cathodes of the diodes 119 are coupled to the data lines 105 and electrostatic discharge ring 109 respectively. The anodes and the cathodes of the diodes 121 are coupled to the electrostatic discharge ring 109 and data lines 105 respectively. The third electrostatic protection circuits 103 includes diodes 123 and diodes 125, in which the anodes and the cathodes of the diodes 123 are coupled to the scan lines 101 and electrostatic discharge ring 109 respectively. The anodes and the cathodes of the diodes 125 are coupled to the electrostatic discharge ring 109 and scan lines 101 respectively.

If there is a positive electrostatic current on the data lines 105, the diodes 119 turn on, so that the positive electrostatic can be discharged to the electrostatic discharge ring 109 through the diode 119. If there is a negative electrostatic current on the data lines 105, the diodes 121 turn on, so that the negative electrostatic current can be discharged to the electrostatic discharge ring 109 through the diode 121. In the same way, the electrostatic current on the scan lines 101 can be discharged to the electrostatic discharge ring 109 through diodes 123 and 125.

In addition, if there is an electrostatic on the FPC 113, the first electrostatic protection circuit 117 is able to prevent the electrostatic current on the FPC 113 from entering the substrate 100. The first electrostatic protection circuit 117 is also able to consume the electrostatic current. Therefore, the electronic components on the substrate 100 can be saved from being damaged by the electrostatic current.

Figure 2A:
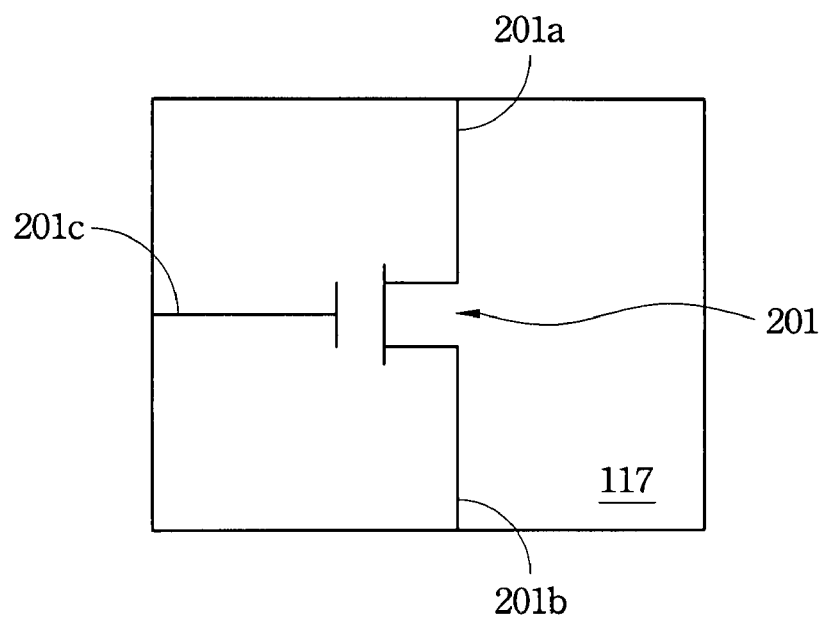
FIG. 2A is one type of the first electrostatic protection circuit according to one embodiment of present invention.

FIG. 2A shows one kind of the first electrostatic protection circuit according to one embodiment of the present invention. The first electrostatic protection circuit 117 can be a transistor 201. The first source/drain 201a and the second source/drain 201b of the transistor 201 are coupled to the electrostatic discharge ring 109 and FPC 113, respectively. The gate 201c of the transistor 201 is floating.

Because the gate 201c of the transistor 201 is floating, the transistor 201 is off, which blocks the electrostatic current on the FPC 113 from entering the electrostatic discharge ring 109 on the substrate 100. So the electronic components on the substrate 100 can be saved from being damaged by the electrostatic current from the FPC 113.

Figure 2B:
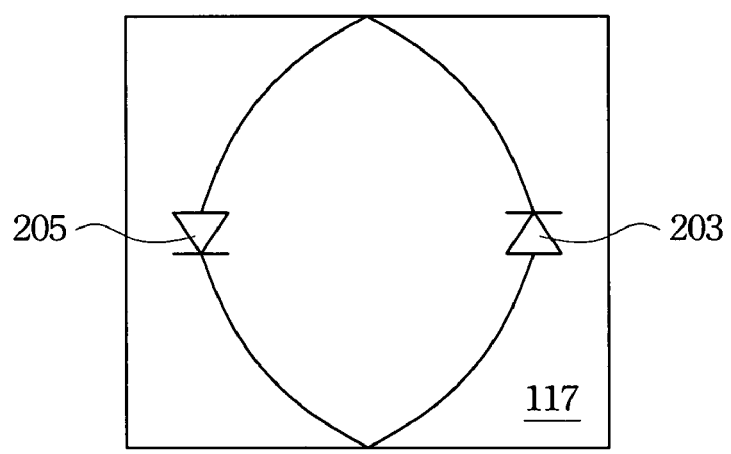
FIG. 2B is another type of the first electrostatic protection circuit according to one embodiment of present invention.

FIG. 2B shows another kind of the first electrostatic protection circuit according to one embodiment of the present invention. The first electrostatic protection circuit 117 includes the diode 203 and the diode 205. The anode and cathode of the diode 203 are coupled to the FPC 113 and electrostatic discharge ring 109 respectively. The anode and cathode of the diode 205 are coupled to electrostatic discharge ring 109 and the FPC 113, respectively.

The positive and negative electrostatic currents are consumed by the diode 203 and the diode 205 while they are going from the FPC 113 to the electrostatic discharge ring 109. So the electronic components on the substrate 100 can be saved from being damaged by the electronic from FPC 113.

Figure 2C:
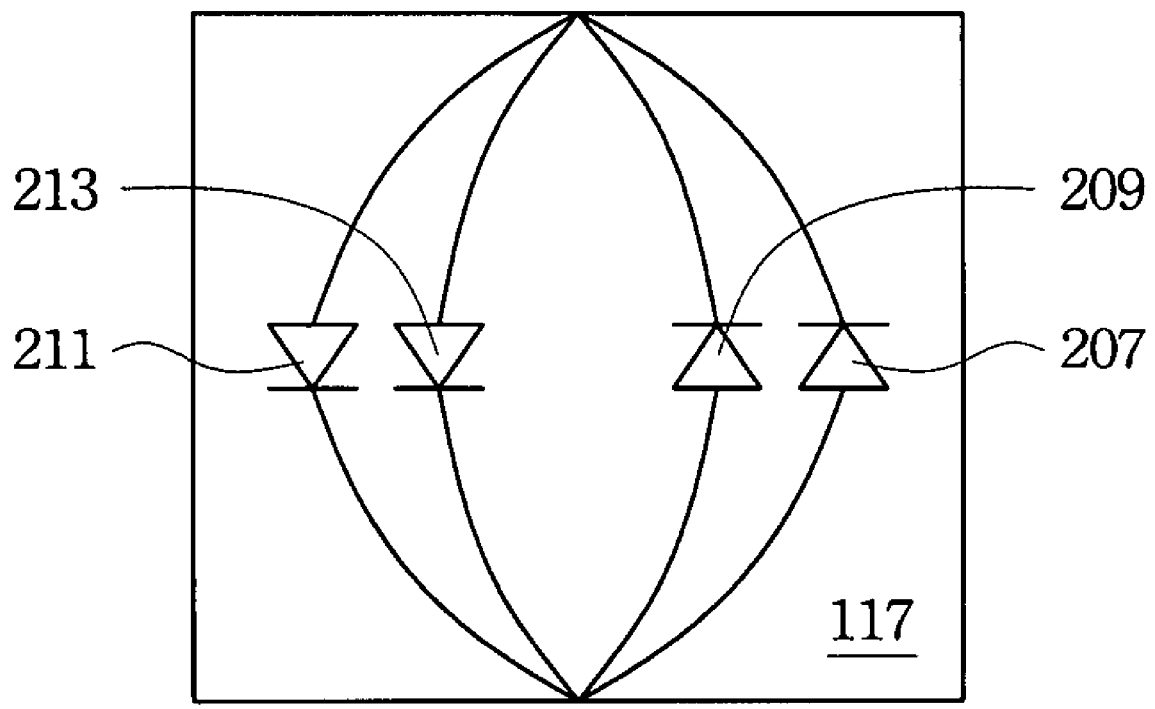
FIG. 2C is the other type of the first electrostatic protection circuit according to one embodiment of present invention.

FIG. 2C shows the other kind of the first electrostatic protection circuit according to one embodiment of the present invention. The first electrostatic protection circuit 117 includes the diode 207, diode 209, diode 211 and diode 213. The disposing of diode 207, diode 209, diode 211 and diode 213 are the same as diode 203 and diode 205 shown in FIG. 2B. With two more diodes added, the first electrostatic protection circuit 117 can consume the electrostatic current more effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active matrix device, comprising:
   a substrate;
   a plurality of scan lines disposed on the substrate;
   a plurality of data lines disposed on the substrate, wherein the data lines cross the scan lines;
   a plurality of pixels electrically coupled to the data lines and the scan lines;
   a electrostatic discharge ring disposed on the substrate;
   a circuit board; and
   an electrostatic protection circuit, coupled between the electrostatic discharge ring and the circuit board, for preventing the electrostatic current on the circuit board from entering the substrate.

2. The device of claim 1, wherein the electrostatic protection circuit is a transistor, having a first source/drain coupled to the electrostatic discharge ring, having a second source/drain coupled to the circuit board, and having a gate being floating.

3. The device of claim 1, wherein the electrostatic protection circuit comprises:
   at least one first diode, having an anode coupled to the electrostatic discharge ring, and having a cathode coupled to the circuit board; and
   at least one second diode, having an anode coupled to the circuit board, and having a cathode coupled to the electrostatic discharge ring.

4. The device of claim 1, wherein the circuit board is a flexible printed circuit board.

5. An active matrix device, comprising:
   a substrate;
   a plurality of scan lines disposed on the substrate;
   a plurality of data lines disposed on the substrate, wherein the data lines cross the scan lines;
   a plurality of pixels electrically coupled to the data lines and the scan lines;
   a electrostatic discharge ring disposed on the substrate;
   a circuit board;
   a first electrostatic protection circuit, coupled to the electrostatic discharge ring and the circuit board, for preventing the electrostatic current on the circuit board from entering the substrate; and
   a plurality of second electrostatic protection circuits coupled to the electrostatic discharge ring and the data lines, wherein each second electrostatic protection circuit comprises:
   at least one first diode, having an anode coupled to the electrostatic discharge ring, and having a cathode coupled to one of the data lines; and
   at least one second diode, having an anode coupled to one of the data lines, and having a cathode coupled to the electrostatic discharge ring.

6. The device of claim 5, further comprising a plurality of third electrostatic protection circuits coupled to the electrostatic discharge ring and the scan lines, wherein each third electrostatic protection circuit comprises:
   at least one third diode, having an anode coupled to the electrostatic discharge ring, and having a cathode coupled to one of the data lines; and
   at least one forth diode, having an anode coupled to one of the data lines, and having a cathode coupled to the electrostatic discharge ring.

7. The device of claim 5, wherein the first electrostatic protection circuit is a transistor, having a first source/drain coupled to the electrostatic discharge ring, having a second source/drain coupled to the circuit board, and having a gate being floating.

8. The device of claim 5, wherein the first electrostatic protection circuit comprises:

at least one fifth diode, having an anode coupled to the electrostatic discharge ring, and having a cathode coupled to the circuit board; and at least one sixth diode, having an anode coupled to the circuit board, and having a cathode coupled to the electrostatic discharge ring.

* * * * *